(12) United States Patent
Collins et al.

(10) Patent No.: US 9,006,702 B2
(45) Date of Patent: *Apr. 14, 2015

(54) SEMICONDUCTOR STRUCTURE INCLUDING A ZIRCONIUM OXIDE MATERIAL

(71) Applicant: Micron Technology, Inc., Boise, ID (US)

(72) Inventors: Dale W. Collins, Boise, ID (US); D. V. Nirmal Ramaswamy, Boise, ID (US); Matthew N. Rocklein, Boise, ID (US); Swapnil A. Lengade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/158,898

(22) Filed: Jan. 20, 2014

(65) Prior Publication Data

US 2014/0191229 A1  Jul. 10, 2014

Related U.S. Application Data

(63) Continuation of application No. 13/601,127, filed on Aug. 31, 2012, now Pat. No. 8,637,846.

(51) Int. Cl.
*H01L 29/24* (2006.01)
*H01L 21/02* (2006.01)
*H01G 9/04* (2006.01)

(52) U.S. Cl.
CPC .......... *H01L 29/24* (2013.01); *H01L 21/02565* (2013.01); *H01G 9/04* (2013.01)

(58) Field of Classification Search
None
See application file for complete search history.

(56) References Cited

U.S. PATENT DOCUMENTS

| | | | |
|---|---|---|---|
| 7,169,637 B2 | 1/2007 | Zhang et al. | |
| 7,935,953 B2 | 5/2011 | Ahn et al. | |
| 8,618,525 B2 * | 12/2013 | Wang et al. | 257/4 |
| 8,637,846 B1 * | 1/2014 | Collins et al. | 257/4 |
| 8,679,988 B2 * | 3/2014 | Lee et al. | 438/785 |
| 2005/0040482 A1 * | 2/2005 | Suzuki et al. | 257/411 |
| 2010/0196592 A1 | 8/2010 | Kim et al. | |
| 2011/0204019 A1 * | 8/2011 | Bornstein et al. | 216/13 |
| 2011/0220862 A1 * | 9/2011 | Arita et al. | 257/4 |
| 2012/0086104 A1 | 4/2012 | Marsh | |
| 2012/0112151 A1 | 5/2012 | Srinivasan et al. | |
| 2012/0122290 A1 | 5/2012 | Nagashima | |
| 2012/0140543 A1 * | 6/2012 | Liu et al. | 365/100 |
| 2013/0043452 A1 * | 2/2013 | Meyer et al. | 257/4 |

OTHER PUBLICATIONS

"Indefinite and Definite Articles" downloaded from URL < http://www.talkenglish.com/Grammar/articles.aspx > on Oct. 31, 2014.*
Definition of Accordance downloaded from URL < http://www.merriam-webster.com/dictionary/accordance > on Oct. 31, 2014.*

* cited by examiner

*Primary Examiner* — Joseph Schoenholtz
(74) *Attorney, Agent, or Firm* — Brooks, Cameron & Huebsch, PLLC

(57) ABSTRACT

Semiconductor structures including a zirconium oxide material and methods of forming the same are described herein. As an example, a semiconductor structure can include a zirconium oxide material, a perovskite structure material, and a noble metal material formed between the zirconium oxide material and the perovskite structure material.

20 Claims, 3 Drawing Sheets

SEMICONDUCTOR STRUCTURE INCLUDING A ZIRCONIUM OXIDE MATERIAL

PRIORITY INFORMATION

This application is a continuation of U.S. application Ser. No. 13/601,127, filed Aug. 31, 2012, which issues on Jan. 28, 2014, as U.S. Pat. No. 8,637,846, which is incorporated by reference.

FIELD OF DISCLOSURE

The present disclosure relates generally to semiconductor structures and methods, and more particularly to semiconductor structures including a zirconium oxide material.

BACKGROUND

Semiconductor devices are devices that utilize a semiconductor structure, e.g., that includes a semiconductor material. Semiconductor devices may be employed for a variety of applications, such as optics, magnetics, fuel cells, and memory cells such as resistive random access memory (RRAM) cells among other applications.

The performance of semiconductor devices may be affected by the semiconductor structure. For example, some semiconductor structures having an improved crystallinity may provide enhanced electrical performance as compared to less crystalline semiconductor structures.

DETAILED DESCRIPTION

Figure 1A:
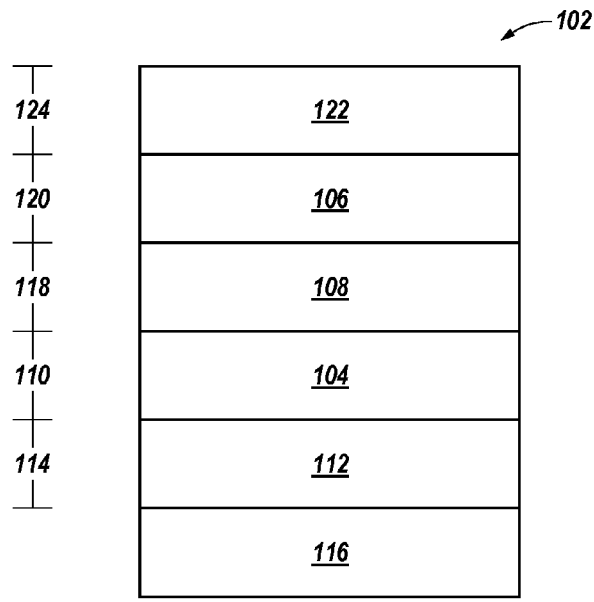
FIGS. 1A, 1B, and 1C are schematic diagrams of portions of semiconductor structures in accordance with a number of embodiments of the present disclosure.

Semiconductor structures including a zirconium oxide material and methods of forming the same are described herein. As an example, a semiconductor structure can include a zirconium oxide material, a perovskite structure material, and a noble metal material located between the zirconium oxide material and the perovskite structure material. The semiconductor structures described herein can be utilized for various applications. For example, the semiconductor structures can be utilized for optics, magnetics, fuel cells, and RRAM cells among other applications.

A number of embodiments of the present disclosure can provide an improved crystallinity of a perovskite structure, e.g., PCMO, as compared to other approaches such as approaches not including a zirconium oxide material. Forming a zirconium oxide prior to forming a perovskite structure material can promote crystallinity of the perovskite structure material for instance. The improved crystallinity of the perovskite structure material can provide benefits such as increased conductivity and/or increased oxygen mobility for the perovskite structure material, among other benefits. Additionally, the zirconium oxide can promote crystallinity of the perovskite structure material across, e.g., in the center and at the edge, a semiconductor structure, e.g., a uniform crystallinity across a wafer. Uniform crystallinity of the perovskite structure material across a semiconductor structure can provide improved electrical characteristics, e.g., with regard to conductivity and/or increased oxygen mobility, as compared to other semiconductor structures having a non-uniform crystallinity. The improved crystallinity of the perovskite structure material and/or the improved uniform crystallinity of the perovskite structure material across a semiconductor structure can provide enhanced electronic performance, as compared to structures not including the zirconium oxide material.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Also, as used herein, "a number of" a particular element and/or feature can refer to one or more of such elements and/or features.

FIG. 1A is a schematic diagram of a portion of a semiconductor structure 102 in accordance with a number of embodiments of the present disclosure. The semiconductor structure 102 includes a zirconium oxide material 104, a perovskite structure material 106, and a noble metal material 108 formed between the zirconium oxide material 104 and the perovskite structure material 106. The semiconductor structure 102 can be formed in accordance with embodiments described herein. The semiconductor structure 102 can be formed using various processing techniques such as atomic material deposition (ALD), physical vapor deposition (PVD), chemical vapor deposition (CVD), supercritical fluid deposition (SFD), or other suitable processes.

The zirconium oxide material 104 is a metal oxide that may be referred to as ZrOx. As mentioned, the zirconium oxide material 104 can promote crystallinity of the perovskite structure material 106 and/or promote crystallinity of the perovskite structure material 106 across a semiconductor structure 102, e.g., across a wafer. In a number of embodiments, the zirconium oxide material 104 is formed via atomic layer deposition; however, embodiments are not limited to this example. The deposition process may utilize an oxidant, such as ozone ($O_3$). The zirconium oxide material 104 can have a thickness 110 in a range of about 5 angstroms to about 70 angstroms for instance.

In a number of embodiments, the zirconium oxide material 104 can be formed on a dielectric material 112. The dielectric material 112 can be tetraethyl orthosilicate, which can be referred to as TEOS ($Si(OC_2H_5)_4$), a silicon oxide ($SiO/SiO_2$), or a silicon nitride ($SiN/Si_2N/Si_3N_4$), among other dielectric materials. The dielectric material 112 can have a thickness 114. The dielectric material 112 can be formed via chemical vapor deposition or physical vapor deposition, for example.

In a number of embodiments, the dielectric material 112 can be formed on a base semiconductor material 116. The base semiconductor material 116 can be a full or partial wafer of semiconductor material such as silicon, gallium arsenide, indium phosphide, etc., a full or partial silicon-metal-on-insulator (SMOI) type substrate, such as a silicon-on-glass (SOG), silicon-on-ceramic (SOC), or silicon-on-sapphire (SOS) substrate, or other suitable fabrication substrate. As used herein, the teem "wafer" includes conventional wafers as well as other bulk semiconductor substrates.

In a number of embodiments, the semiconductor structure 102 can include a noble metal material 108. As shown in FIG. 1A, the noble metal material 108 can be formed between the zirconium oxide material 104 and the perovskite structure material 106. The noble metal material 108 can be resistant to corrosion and/or oxidation, as compared to a base metal, such as iron, nickel, lead, or zinc. The noble metal material 108 can be, for example, selected from platinum, palladium, rhodium, ruthenium, iridium, gold, and/or combinations thereof. The noble metal material 108 can be formed via chemical vapor deposition or physical vapor deposition, for example. The noble metal material 108 can have a thickness 118 in a range of about 10 nanometers to about 100 nanometers. In a number of embodiments, the noble metal material 108 can serve as an electrode of the semiconductor structure 102.

Figure 1B:
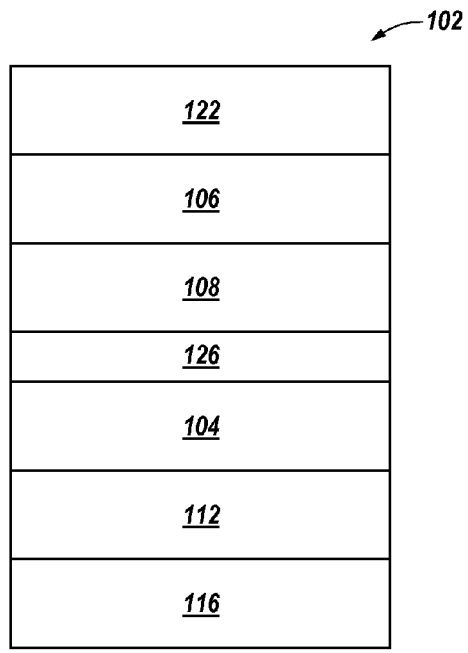
Figure 1C:
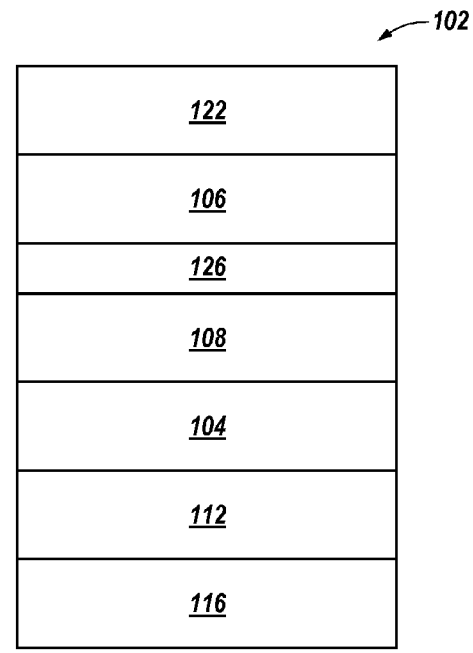

As shown in FIGS. 1B and 1C, in a number of embodiments, the semiconductor structure 102 can include a conductive material 126. The conductive material 126 can include materials such as Ti, Ta, W, Al, Cr, Zr, Nb, Mo, Hf, B, C, conductive nitrides of the aforementioned materials, e.g., TiN, TaN, WN, CN, etc., and/or combinations thereof. The conductive material 126 can be formed by a deposition process, such as chemical vapor deposition or physical vapor deposition, for example. In a number of embodiments, the conductive material 126 can be formed on the zirconium oxide material 104, as shown in FIG. 1B. However, embodiments are not so limited. For example, the conductive material 126 can be formed on the noble metal material 108, as shown in FIG. 1C. The conductive material can have a thickness in a range of about 10 nanometers to about 100 nanometers.

As shown in FIG. 1A, the semiconductor structure 102 can include a perovskite structure material 106. The perovskite structure material 106 can be represented by a number of formulas. For example, the perovskite structure material 106 can have the formula $ABO_3$, $[ABO_3]_n$ $(AO)$, or $A_2B_2O_5$, among other formulas, where, "A" and "B" are cations that are located respectively at the A site and B site of the perovskite structure material 106 and "O" is oxygen. In a number of embodiments, the perovskite structure material 106 can be doped. For example, the "A" sites of the perovskite structure material 106 can include "A" atoms and "A'" atoms, where "A" atoms represent a particular element and "A'" atoms represent a dopant. Similarly, the "B" sites of the perovskite structure material 106 can include "B" atoms and "B'" atoms, where "B" atoms represent a particular element and "B'" atoms represent a dopant. In a number of embodiments, the perovskite structure material 106 can be a PCMO material, e.g., $((Pr_{0.7}Ca_{0.3})MnO_3$.

As illustrated in FIG. 1A, the perovskite structure material 106 can be formed on the noble metal material 108. The perovskite structure material 106 can be formed by a process, e.g., sputtering, among other processes. In a number of embodiments, the perovskite structure material 106 can have a thickness 120 in a range of about 50 angstroms to about 200 angstroms. In a number of embodiments, the perovskite structure material 106 can be a resistance variable material, which can be programmed into different resistance states and be used for a number of applications, such as optics, magnetics, fuel cells, and RRAM cells among other applications.

In a number of embodiments, the semiconductor structure 102 can include an electrode material 122. As shown in FIG. 1A, the electrode material 122 can be formed on the perovskite structure material 106. The electrode material 122 can be, for instance, platinum, palladium, rhodium, ruthenium, iridium, gold, and/or combinations thereof, among other electrode materials. The electrode material 122 can be formed by a deposition process, such as chemical vapor deposition or physical vapor deposition, for example. The electrode material 122 can have a thickness 124 in a range of 10 nanometers to 100 nanometers. In a number of embodiments, the electrode material 122 can serve as an electrode of the semiconductor structure 102, e.g., the electrode material can be coupled to a conductive line corresponding to the structure, such as a bit line or word line, for instance.

Figure 2:
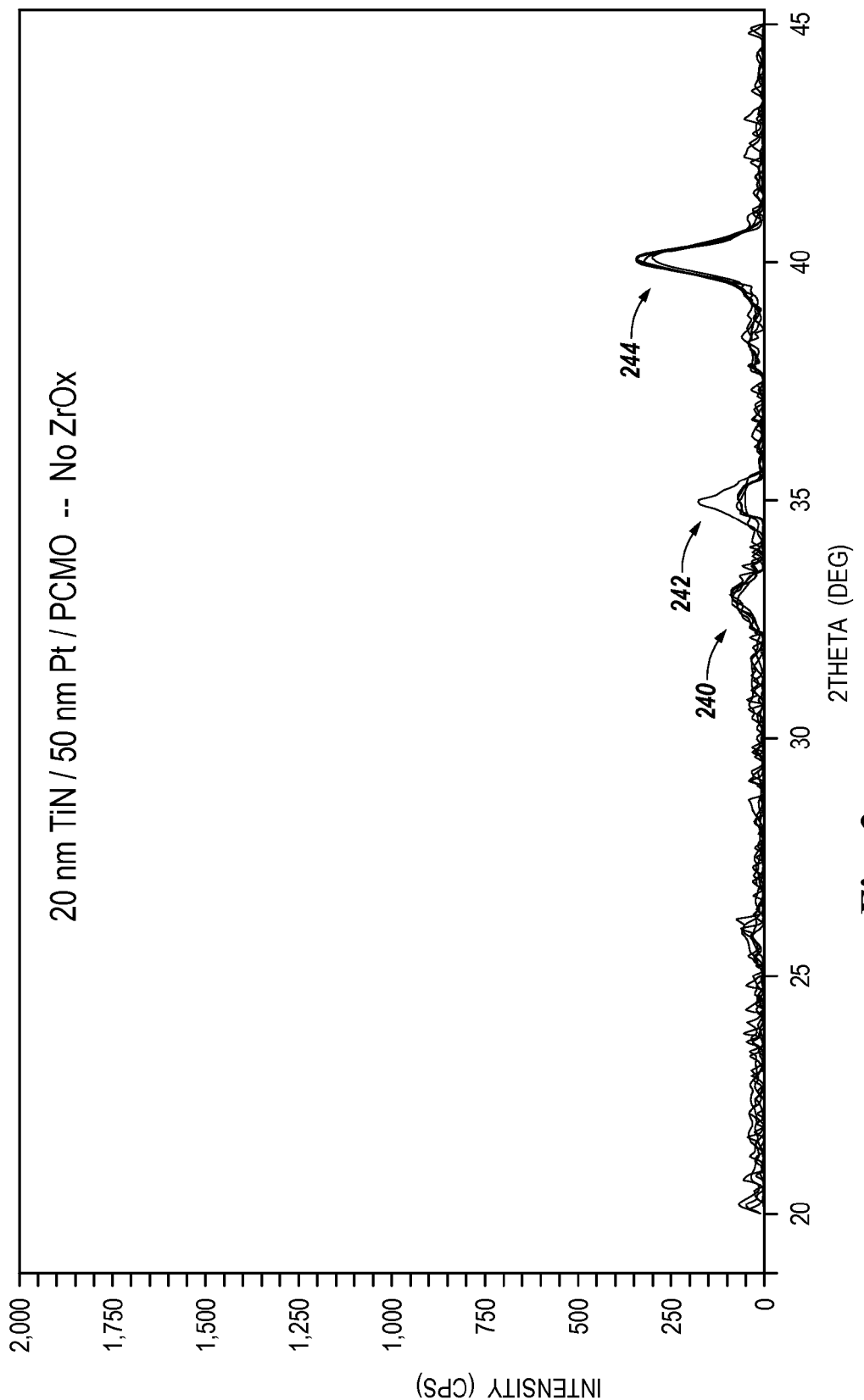
FIG. 2 illustrates a radial scan obtained via radial x-ray diffraction of a semiconductor structure. The radial scan illustrated in FIG. 2 illustrates curves, which represent intensity, in counts per second (cps), versus degrees (2 theta, where theta is equal to 90 degrees).

FIG. 2 illustrates a radial scan obtained via radial x-ray diffraction of a semiconductor structure. The radial scan illustrated in FIG. 2 illustrates curves, which represent intensity, in counts per second (cps), versus degrees (2 theta, where theta is equal to 90 degrees). The semiconductor structure associated with FIG. 2 was a wafer that included a TiN material (20 nanometer thickness), a platinum material (50 nanometer thickness) formed on the TiN material, and a PCMO material formed on the platinum material. The radial x-ray diffraction included x-ray diffraction for five locations on the wafer from the center of the wafer to the edge of the wafer. The five locations on the wafer were at 0 millimeters (center of the wafer), 30 millimeters, 60 millimeters, 90 millimeters, and 120 millimeters (edge of the wafer). The radial scan diagram illustrated in FIG. 2 illustrates curves, which represent intensity, in counts per second (cps), versus degrees (2 theta, where theta is equal to 90 degrees). In FIG. 2, curve 230 corresponds to 0 millimeters, curve 232 corresponds to 30 millimeters, curve 234 corresponds to 60 millimeters, curve 236 corresponds to 90 millimeters, and curve 238 corresponds to 120 millimeters.

As illustrated in FIG. 2, the curves 230 to 238 delineate a peak 240 at approximately 33 degrees that corresponds to PCMO, a peak 242 at approximately 35 degrees that corresponds to TiN, and a peak 244 at approximately 40 degrees that corresponds to platinum. Each of the peaks 240 to 244 illustrated in FIG. 2 have an intensity value below about 500 cps, e.g., a weak intensity, which indicates that the materials, PCMO, TiN, and platinum, lack a crystalline structure at the five x-ray diffraction locations.

Figure 3:
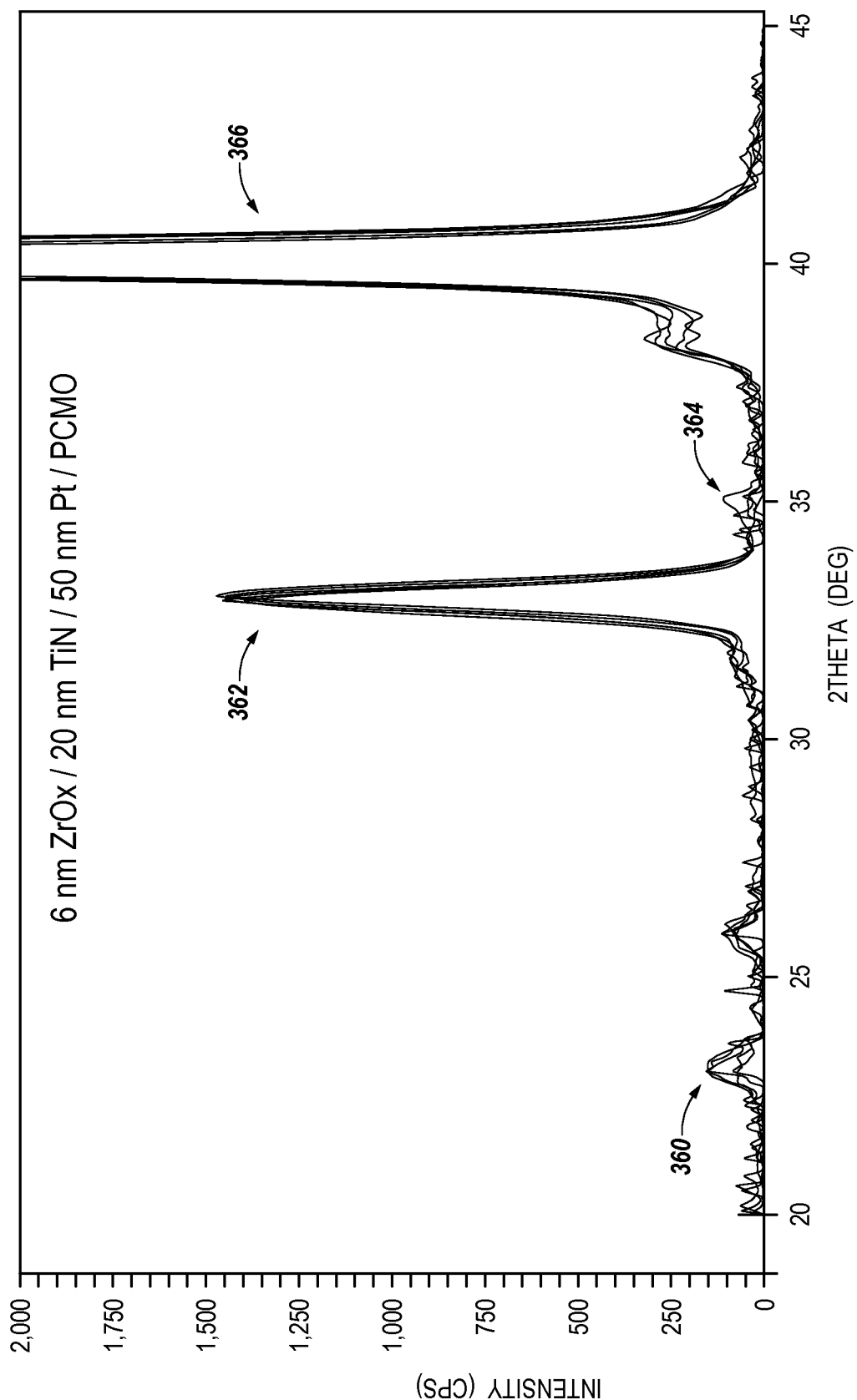
FIG. 3 illustrates a radial scan obtained via radial x-ray diffraction of a semiconductor structure in accordance with one or more embodiments of the present disclosure. The radial scan illustrated in FIG. 3 illustrates curves, which represent intensity, in counts per second (cps), versus degrees (2 theta, where theta is equal to 90 degrees).

FIG. 3 illustrates a radial scan obtained via radial x-ray diffraction of a semiconductor structure in accordance with one or more embodiments of the present disclosure. The radial scan illustrated in FIG. 3 illustrates curves, which represent intensity, in counts per second (cps), versus degrees (2 theta, where theta is equal to 90 degrees). The semiconductor structure associated with FIG. 3 was a wafer that included a zirconium oxide material (6 nanometer thickness), a TiN material (20 nanometer thickness) formed on the zirconium oxide material, a platinum material (50 nanometer thickness) formed on the TiN material, and a PCMO material formed on the platinum material. The radial x-ray diffraction included x-ray diffraction for five locations, at 0 millimeters (center of the wafer), 30 millimeters, 60 millimeters, 90 millimeters, and 120 millimeters (edge of the wafer), on the wafer from the center of the wafer to the edge of the wafer. In FIG. 3, curve 350 corresponds to 0 millimeters, curve 352 corresponds to 30 millimeters, curve 354 corresponds to 60 millimeters, curve 356 corresponds to 90 millimeters, and curve 358 corresponds to 120 millimeters.

As illustrated in FIG. 3, the curves 350 to 358 delineate a peak 360 at approximately 23 degrees that corresponds to the zirconium oxide material, a peak 362 at approximately 33 degrees that corresponds to PCMO, a peak 364 at approximately 35 degrees that corresponds to TiN, and a peak 366 at approximately 40 degrees that corresponds to platinum. Each of the peaks 360 and 364 illustrated in FIG. 3 have a weak intensity that indicates that the materials, zirconium oxide material and TiN, lack a crystalline structure at the five x-ray diffraction locations. However, in contrast to FIG. 2, each of the peaks 362 and 366 illustrated in FIG. 3 have an intensity value above 500 cps, e.g., an increased intensity as compared to the structure of FIG. 2, which indicates that the materials, PCMO and platinum, have a crystalline structure at each of the five x-ray diffraction locations. In this example, the PCMO peak 362 is at approximately 1500 cps and the platinum peak is above 2000 cps. The data represented by curves 350 to 358 indicates that the zirconium oxide material can promote crystallinity of a perovskite structure material, e.g., PCMO, and that the crystallinity of the perovskite structure is improved as compared to other approaches, such as approaches not including the zirconium oxide material, e.g., the data represented by curves 230 to 236 illustrated in FIG. 2. Additionally, the data represented by curves 350 to 358 indicates that the zirconium oxide material can promote uniform crystallinity of the perovskite structure material across the semiconductor structure.

As mentioned, the improved crystallinity of the perovskite structure material and/or the improved uniform crystallinity of the perovskite structure material across a semiconductor structure can provide enhanced electronic performance, as compared to structures not including the zirconium oxide material. Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A semiconductor structure comprising:
   a zirconium oxide material formed on a dielectric material, wherein the zirconium oxide material directly contacts the dielectric material;
   a perovskite structure material; and
   a noble metal material, wherein the zirconium oxide material, the dielectric material, the perovskite structure material, and the noble metal material are formed between a base semiconductor material and an electrode material.

2. The semiconductor structure of claim 1, wherein the noble metal material is formed on the zirconium oxide material.

3. The semiconductor structure of claim 1, wherein the perovskite structure material is formed on the noble metal material.

4. The semiconductor structure of claim 1, wherein the electrode material is formed on the perovskite structure material.

5. The semiconductor structure of claim 1, including a conductive material formed on the zirconium oxide material.

6. The semiconductor structure of claim 5, wherein the conductive material includes Ti, Ta, W, Al, Cr, Zr, Nb, Mo, Hf, B, C, or combinations thereof.

7. The semiconductor structure of claim 1, including a conductive material formed on the noble metal material.

8. The semiconductor structure of claim 7, wherein the conductive material includes Ti, Ta, W, Al, Cr, Zr, Nb, Mo, Hf, B, C, or combinations thereof.

9. A method of forming a semiconductor structure comprising:
   forming a dielectric material;
   forming a zirconium oxide material on the dielectric material, wherein the zirconium oxide material directly contacts the dielectric material;
   forming a noble metal material; and
   forming a perovskite structure material, wherein the zirconium oxide material, the dielectric material, the perovskite structure material, and the noble metal material are formed between a base semiconductor material and an electrode material.

10. The method of claim 9, wherein forming the perovskite structure material includes sputtering.

11. The method of claim 9, wherein, forming the zirconium oxide material includes utilizing atomic layer deposition.

12. The method of claim 11, wherein, the atomic layer deposition utilizes an oxidant.

13. The method of claim 11, wherein, the oxidant comprises ozone.

14. The method of claim 9, wherein forming the noble metal material includes utilizing vapor deposition.

15. The method of claim 9, where the zirconium oxide material is formed prior to forming the perovskite structure material.

16. A semiconductor structure comprising:
    a resistance variable material;
    a crystallinity promoting material that promotes crystallinity of the resistance variable material and is formed on a dielectric material, wherein the crystallinity promoting material directly contacts the dielectric material; and
    a noble metal material; wherein the crystallinity promoting material, the dielectric material, the resistance variable material, and the noble metal material are formed between a base semiconductor material and an electrode material.

17. The semiconductor structure of claim 16, wherein the resistance variable material comprises a PCMO material.

18. The semiconductor structure of claim 16, wherein the resistance variable material comprises $(Pr_{0.7}Ca_{0.3})MnO_3$.

19. The semiconductor structure of claim 16, wherein the resistance variable material is configured to be programmable into different resistance states.

20. The semiconductor structure of claim 16, wherein the resistance variable material includes a dopant.

\* \* \* \* \*